(12) United States Patent
Podval (10) Patent No.: US 9,831,144 B2
(45) Date of Patent: Nov. 28, 2017

(54) SEMICONDUCTOR DIE AND PACKAGE JIGSAW SUBMOUNT

(71) Applicant: QUBEICON LTD., Rishon LeZion (IL)

(72) Inventor: Shimon Podval, Rishon LeZion (IL)

(73) Assignee: QUBEICON LTD., Rishon LeZion (IL)

( * ) Notice: Subject to any disclaimer, the term of this patent is extended or adjusted under 35 U.S.C. 154(b) by 0 days.

(21) Appl. No.: 14/428,376

(22) PCT Filed: Aug. 28, 2013

(86) PCT No.: PCT/IL2013/050730
§ 371 (c)(1),
(2) Date: Mar. 16, 2015

(87) PCT Pub. No.: WO2015/029004
PCT Pub. Date: Mar. 5, 2015

(65) Prior Publication Data
US 2016/0163610 A1    Jun. 9, 2016

(51) Int. Cl.
*H05K 1/18* (2006.01)
*H01L 23/13* (2006.01)
(Continued)

(52) U.S. Cl.
CPC ........ *H01L 23/13* (2013.01); *H01L 23/49838* (2013.01); *H01L 23/49855* (2013.01);
(Continued)

(58) Field of Classification Search
CPC .. H05K 1/00; H05K 1/14; H05K 1/18; H05K 3/00; H05K 3/34; H05K 3/36; H05K 3/40;
(Continued)

(56) References Cited

U.S. PATENT DOCUMENTS 3,984,859 A * 10/1976 Misawa .................. H01L 29/00
257/495
5,239,198 A * 8/1993 Lin ......................... H01L 21/56
257/691
(Continued)

FOREIGN PATENT DOCUMENTS

EP    0720232    4/2007

OTHER PUBLICATIONS

International Search Report dated Jan. 8, 2014 for PCT/2013/050730 filed Aug. 28, 2013.

*Primary Examiner* — Xiaoliang Chen
(74) *Attorney, Agent, or Firm* — A.C. Entis-IP Ltd.

(57) ABSTRACT

A submount for connecting a semiconductor device to an external circuit, the submount comprising: a planar substrate formed from an insulating material and having relatively narrow edge surfaces and first and second relatively large face surfaces; at least one recess formed along an edge surface; a layer of a conducting material formed on a surface of each of the at least one recess; a first plurality of soldering pads on the first face surface configured to make electrical contact with a semiconductor device; and electrically conducting connections each of which electrically connects a soldering pad in the first plurality of soldering pads to the layer of conducting material of a recess of the at least one recess.

18 Claims, 5 Drawing Sheets

(51) Int. Cl.
  H01L 23/498    (2006.01)
  H01L 25/065    (2006.01)
  H05K 1/11      (2006.01)
  H05K 1/14      (2006.01)
  H05K 1/02      (2006.01)
  H01L 23/00     (2006.01)
  H05K 3/34      (2006.01)

(52) U.S. Cl.
  CPC ....... H01L 25/0655 (2013.01); H05K 1/0204 (2013.01); H05K 1/117 (2013.01); H05K 1/141 (2013.01); H05K 3/3442 (2013.01); H01L 24/05 (2013.01); H01L 24/06 (2013.01); H01L 24/13 (2013.01); H01L 24/16 (2013.01); H01L 24/45 (2013.01); H01L 24/48 (2013.01); H01L 24/49 (2013.01); H01L 24/73 (2013.01); H01L 24/81 (2013.01); H01L 2224/0401 (2013.01); H01L 2224/04042 (2013.01); H01L 2224/05554 (2013.01); H01L 2224/05555 (2013.01); H01L 2224/06135 (2013.01); H01L 2224/131 (2013.01); H01L 2224/16225 (2013.01); H01L 2224/45124 (2013.01); H01L 2224/45144 (2013.01); H01L 2224/45147 (2013.01); H01L 2224/48091 (2013.01); H01L 2224/48227 (2013.01); H01L 2224/48464 (2013.01); H01L 2224/48465 (2013.01); H01L 2224/48471 (2013.01); H01L 2224/48472 (2013.01); H01L 2224/49113 (2013.01); H01L 2224/49177 (2013.01); H01L 2224/73265 (2013.01); H01L 2224/81203 (2013.01); H01L 2224/81205 (2013.01); H01L 2224/81385 (2013.01); H01L 2924/00014 (2013.01); H01L 2924/15162 (2013.01); H01L 2924/15192 (2013.01); H05K 3/3415 (2013.01); H05K 2201/041 (2013.01); H05K 2201/0939 (2013.01); H05K 2201/09063 (2013.01); H05K 2201/09154 (2013.01); H05K 2201/09163 (2013.01); H05K 2201/09472 (2013.01); Y02P 70/613 (2015.11)

(58) Field of Classification Search
  CPC ......... H01L 21/02; H01L 21/50; H01L 21/60; H01L 23/12; H01L 23/16; H01L 23/28; H01L 23/48
  USPC ........ 174/252, 255; 257/686, 693, 696, 707, 257/724; 361/761, 766; 438/109, 202, 438/460
  See application file for complete search history.

(56) References Cited

U.S. PATENT DOCUMENTS

| | | | | |
|---|---|---|---|---|
| 5,811,879 A | * | 9/1998 | Akram | H01L 25/0655 257/680 |
| 5,821,614 A | * | 10/1998 | Hashimoto | H05K 1/148 235/492 |
| 6,147,876 A | * | 11/2000 | Yamaguchi | H01L 23/24 257/698 |
| 6,545,868 B1 | * | 4/2003 | Kledzik | H01L 25/105 257/686 |
| 6,573,028 B1 | * | 6/2003 | Yamamoto | H01L 21/561 257/E23.004 |
| 6,713,854 B1 | * | 3/2004 | Kledzik | H05K 1/141 174/252 |
| 6,830,959 B2 | | 12/2004 | Estacio | |
| 2002/0047210 A1 | * | 4/2002 | Yamada | H01L 21/76898 257/774 |
| 2003/0232489 A1 | * | 12/2003 | Mizutani | H05K 3/0052 438/460 |
| 2004/0007771 A1 | * | 1/2004 | Shin | H01L 23/13 257/686 |
| 2004/0008982 A1 | * | 1/2004 | Matsuo | G02B 7/28 396/89 |
| 2004/0014270 A1 | * | 1/2004 | Mizutani | H05K 3/0052 438/202 |
| 2005/0168960 A1 | * | 8/2005 | Asahi | H01L 21/568 361/761 |
| 2005/0184381 A1 | * | 8/2005 | Asahi | H01R 13/2414 257/693 |
| 2006/0140546 A1 | * | 6/2006 | Nakata | G02B 6/136 385/88 |
| 2009/0026472 A1 | * | 1/2009 | Yasuda | H01L 33/486 257/98 |
| 2009/0072332 A1 | * | 3/2009 | Dekker | B01L 3/502707 257/414 |
| 2009/0108470 A1 | * | 4/2009 | Okada | H01L 24/48 257/777 |
| 2009/0166895 A1 | * | 7/2009 | Noguchi | H05K 1/05 257/786 |
| 2009/0236722 A1 | * | 9/2009 | Nishiyama | H01L 25/18 257/686 |
| 2009/0289342 A1 | * | 11/2009 | Kasuya | H01L 23/49805 257/690 |
| 2010/0022051 A1 | * | 1/2010 | Yu | H01L 21/565 438/109 |
| 2013/0295729 A1 | * | 11/2013 | Nakazawa | H01L 29/0661 438/135 |

* cited by examiner

SEMICONDUCTOR DIE AND PACKAGE JIGSAW SUBMOUNT

RELATED APPLCIATIONS

The present application is a U.S. National Phase of PCT/IL2013/050730 filed on Aug. 28, 2013, the disclosure of which is incorporated herein by reference.

TECHNICAL FIELD

Embodiments of the invention relate to apparatus and methods for electrically connecting a semiconductor die and/or a die package to circuitry with which it is used.

BACKGROUND

Semiconductor devices, whether single component architectures or multi-component semiconductor integrated circuits (ICs), hereinafter generically referred to as ICs, are typically formed in arrays containing large numbers of copies of the devices on a semiconductor wafer. Semiconductor wafers, may by way of example, be formed from Si, GaAs, or GaN. After formation of the ICs, the wafer is separated, "diced", into pieces referred to as "dies", each of which comprises a single copy of an IC formed on the wafer. Components of the IC, such as sources, drains, and gates of transistors, comprised in the die that require electrical connection to external circuitry with which the IC is to operate are electrically connected to conductive contact pads, also referred to as die pads, that are formed on a surface of the die. The dies are typically mounted to a submount and together with the submount are encapsulated in a "die package" by potting or molding in a protective epoxy or plastic. The submount mechanically supports the die and electrically conductive package leads or solder-bumps that extend from the package or are otherwise readily accessible from outside the die package. The die package leads or solder bumps are used to electrically connect the "packaged die" to an external circuit with which the die is to be used and are electrically connected to the die's contact pads by conductive bondwires. The bondwires are usually formed from copper (Cu), aluminum (Al), or gold (Au). It is noted that a die package is not limited to comprising a single die, and may contain more than one die that are optionally electrically connected to each other as well as having contact pads, solder bumps and/or package leads for connecting the package and the dies to external circuits.

Whereas dies before packaging may be referred to as "bare dies", and packaged dies or die packages may be referred to as "chips", conventionally the distinction between dies and chips is often blurred, and chips, dies, and die packages are often used interchangeably. Unless indicated specifically or by context, a die or bare die refers to a "bare die", a "die package" refers to a packaged die or dies, and a "chip" refers generically to bare dies and die packages.

Devices that provide many of today's military, space, and civilian applications, such as radars, communication network elements, computers, cell phones, notebooks, and tablets, typically require electronic circuitry comprising a variety of different chips and electronic components such as passive circuit elements, conventionally referred to as "passives", and other electronic components that provide different functionalities needed for the applications performed by the devices. Some devices may require both digital and analog functionalities and corresponding digital and analog chips. For example, cell phones require analog circuit elements for their RF front end systems as well as digital audio and video signal processors. As many of today's devices shrink in size, and/or are configured to provide larger video interfaces for their operators, space and power available for housing and powering the chips and associated circuit elements that cooperate to provide the devices' applications decreases.

Constraints generated by reduction in space and power available for device circuitry may generally be met by producing electronic circuitry having a smaller footprint. A footprint refers to an area that the circuitry occupies on a printed circuit board on which the circuitry is supported. Reducing a circuitry's footprint may be achieved by reducing the footprints of its components and/or increasing the packing density of the components. Generally, it is not possible or advantageous to provide a desired degree of reduction in a footprint of a given electronic circuitry by forming the architectures of the various chips and circuit elements in the electronic circuitry as components of a single monolithic integrated circuit. Different chip architectures may require different, non-compatible fabrication processes. In addition, it is often not practical to attempt to reproduce the reliability and performance of known operational chips that provide needed circuit functionalities as component architectures of a single monolithic integrated circuit.

In lieu of monolithic, fully integrated circuits, industry has developed multi-chip modules (MCMs) or systems in a package (SIPs), hereinafter generically referred to as MCMs, to reduce space and power requirements of many of today's devices. A MCM is an electronic system comprising a plurality of chips and/or associated electronic components that are assembled on a common substrate or a stack of shared substrates. A substrate, which may be referred to in the art as an "interposer", may, by way of example, be a printed circuit board (PCB), or a thin or thick plate formed from a suitable material such as a ceramic, Si, GaAs, or GaN that comprises a suitable pattern of conducting traces. The chips and electronic components on the substrate or substrates are electrically connected to each other and the conducting traces using conventional techniques. The traces are designed, and the chips and components are located to reduce a foot print of the MCM assembly relative to a footprint the chips and components would have as individual elements conventionally assembled on a PCB, and so that the chips and components may share common power and thermal dissipation resources. The assembled chips and components are encapsulated in an overmolding process so that the MCM appears and functions as a single die package.

SUMMARY

An aspect of an embodiment of the invention relates to providing a submount having a relatively small footprint to which a semiconductor chip and/or a passive may be mounted for connecting the semiconductor device to an external circuit.

In an embodiment of the invention, the submount comprises a planar insulating substrate having two relatively large face surfaces and relatively narrow edge surfaces. A recess having a conductive "contact layer" on at least a portion of a surface, hereinafter also a "recess surface", bounding the recess is formed along an edge surface of the substrate. The contact layer on the recess surface may be electrically connected by at least one conducting element to at least one soldering pad on a face surface of the substrate. Optionally, the at least one conducting element comprises a conducting trace on a face surface of the substrate. In an embodiment of the invention, the at least one conducting element comprises an internal conducting element located in the substrate. Optionally, the substrate is a multilayer substrate comprising a patterned layer of conducting material sandwiched between layers of insulating material and the internal conducting element comprises a region of the patterned layer.

A soldering pad connected to the contact layer may be electrically connected to a die, and/or a die package, and/or a passive, mounted to the face surface to electrically connect the die, die package, and/or passive to the contact layer. A soldering bump on a die or die package may be used to electrically connect the die or die package to the substrate soldering pad or the soldering pad may be electrically connected to the die or die package by a bond-wire. The die and/or die package, and/or passive may be electrically connected to an external circuit by electrically connecting, the recess contact layer to an electrical contact of the external circuit, which may be a trace on a PCB to which the external circuit is connected. Hereinafter, a recess formed in a substrate of a submount and having a contact layer for electrically contacting a die and/or die package, and or passive mounted to the substrate to an external circuit in accordance with an embodiment of the invention may be referred to as a "contact bay". The recess surface bounding the contact bay may be referred to as a "contact bay surface" or "bay surface".

In an embodiment of the invention, a submount may be formed having a plurality of contact bays and/or may be configured to have a plurality chips and/or passives mounted to its substrate. Optionally, both face surfaces of the substrate are configured so that they may be mounted with a chip and/or passive and connect the chip and/or passive to a contact bay of the submount. A submount in accordance with an embodiment of the invention having one or more contact bays has a shape reminiscent of a jigsaw puzzle piece and may hereinafter be referred to as a "jigsaw submount". Hereinafter, whereas electrical connections to a jigsaw submount may be described with references to chips without explicit reference to other types of electrical components, practice of embodiment of the invention is not limited to implementing electrical connections of chips to jigsaw submounts. In general electrical connections to a jigsaw submount similar to those described for chips may be made to other electrical components such as various types of passives.

A contact bay of a jigsaw submount in accordance with an embodiment of the invention may have any of various different shapes and sizes and contact layers, and may be configured to function advantageously under particular operating conditions. For example, a contact bay required to make contact with a relatively large number of traces on one or both face surfaces of a jigsaw submount substrate or to support a relatively large current may be designed having a relatively large bay surface. On the other hand a contact bay intended for contact with one or a relatively small number of traces, or that is not intended to support large currents may have a relatively small bay surface. A first contact bay that is required to carry a high frequency signal may be formed having a relatively small bay surface and be located along an edge of a jigsaw submount in close proximity to a similar, second contact bay that carries a high frequency signal, optionally 180° degrees out of phase, with the signal carried by the first contact bay. The size and proximity of the first and second contact bays may lower inductance of the contact bays. Contact bay surfaces may also be shaped to provide convenient geometries to match trace configurations on a face surface of a jigsaw submount. The bay surface may for example, have a circular, or polyline shape tailored to match a desired layout of traces. A circular bay surface is a bay surface having an edge that is substantially an arc of a circle. A polyline bay surface is a bay surface having an edge that is substantially a polyline.

By providing contact bays along edges of a jigsaw submount for connecting chips to external circuits, regions of both face surfaces of the jigsaw submount become available for mounting chips to the jigsaw submount. In addition, the bays' bay surfaces increase the surface area of the jigsaw edge surface that is available for electrically connecting chips mounted to the jigsaw face surfaces to external circuits. As a result, a jigsaw submount in accordance with an embodiment of the invention having a given face surface area may be mounted with and provide electrical connections for a plurality of chips in a spatial configuration having a relatively small footprint.

An aspect of an embodiment of the invention relates to providing a motherboard, optionally referred to as a "jigsaw motherboard", to which jigsaw submounts may be mounted to electrically connect the various chips they contain and configure circuitry that provides a desired functionality or suite of functionalities. In an embodiment of the invention, a jigsaw motherboard comprises conductive contact regions, hereinafter referred to as "contact lands", on a face surface of the motherboard for making electrical contact with contact bays. Flowing a suitable solder onto a contact land when a contact bay is positioned on the land so that the solder flows and wets the contact layer of the contact bay creates an electrical contact between the land and the contact layer of the contact bay. A contact land may be connected by a suitable conductive trace to a conductive contact on the motherboard that electrically connects the motherboard and thereby the land to a corresponding contact of a socket into which the motherboard may be inserted. By way of example, the conductive contact on the jigsaw motherboard may be an edge connector similar to a conventional edge connector that is used to connect a conventional PCB to an expansion slot of a computer motherboard.

In an embodiment of the invention, a jigsaw motherboard may be formed having recesses into which chips on a jigsaw submount seat when the submount is mounted to the motherboard. A jigsaw motherboard formed having such recesses may support a jigsaw submount having chips mounted to both faces surfaces of the jigsaw submount.

In the discussion, unless otherwise stated, adjectives such as "substantially" and "about" modifying a condition or relationship characteristic of a feature or features of an embodiment of the invention, are understood to mean that the condition or characteristic is defined to within tolerances that are acceptable for operation of the embodiment for an application for which it is intended This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF FIGURES

Non-limiting examples of embodiments of the invention are described below with reference to figures attached hereto that are listed following this paragraph. Identical structures, elements or parts that appear in more than one figure are generally labeled with a same numeral in all the figures in which they appear. A label labeling an icon representing a given feature of an embodiment of the invention in a figure may be used to reference the given feature. Dimensions of components and features shown in the figures are chosen for convenience and clarity of presentation and are not necessarily shown to scale.

DETAILED DESCRIPTION

Figure 1A:
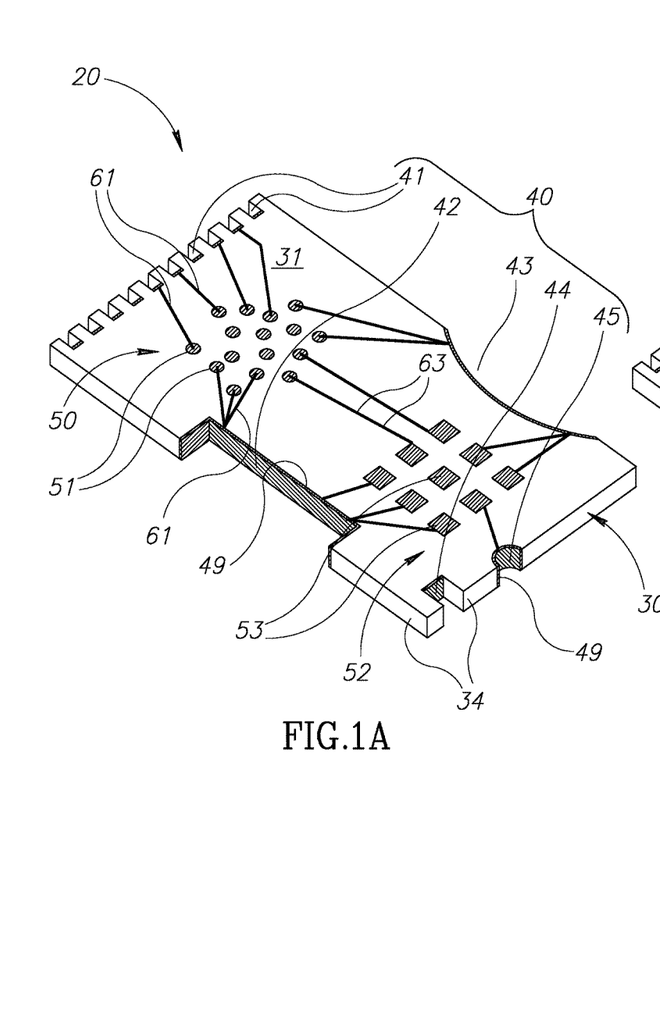
FIGS. 1A and 1B schematically show perspective views of first and second face surfaces of a jigsaw submount formed having a plurality of contact bays and configured to be mounted with a bare die or die package on both face surfaces, in accordance with and embodiment of the invention.
Figure 1B:
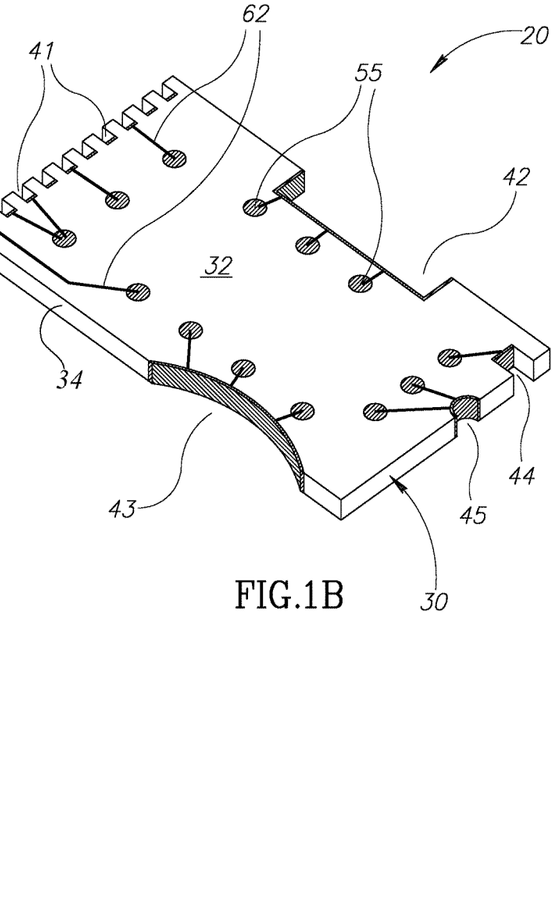

FIGS. 1A and 1B schematically show perspective views of a jigsaw submount 20 for electrically connecting a bare die and/or die package to circuitry with which the die or die package is intended to operate, in accordance with an embodiment of the invention. Jigsaw submount 20 may comprise a substrate 30 formed having a plurality of contact bays, generically labeled by a numeral 40, formed along edge surfaces 34 of the substrate. Contact bays 40 by way of example, comprise a row of relatively small rectangular contact bays 41, relatively large rectangular and curved contact bays 42 and 43 respectively, a rectangular contact bay 44 and a semicircular contact bay 45. Each contact bay 40 comprises a conductive layer, that is, a contact layer 49, covering at least a portion of the bay surface of the contact bay for providing electrical contact to the submount and to bare dies and/or die package that may be mounted to the jigsaw submount.

By way of example, substrate 30 is configured so that bare dies and/or die packages may be mounted to a first face surface 31, shown in FIG. 1A, and/or a second face surface 32, shown in FIG. 1B, of the substrate. First face surface 31 optionally has an array 50 of circular contact pads 51 and an array 52 of rectangular contact pads 53. A contact pad 51 or 53 may be electrically connected to the contact layer 49 of a contact bay 40, and may be electrically connected to a die or die package, for example by soldering to a contact pad, solder bump, or package lead, on the die or die package, to connect the die or die package to the contact bay. Similarly, second face surface 32 shown in FIG. 1B has contact pads 55 for connecting a die or die package to contact bays of jigsaw submount 20.

A contact pad 51, or 53 may be electrically connected to a conductive layer 49 of a contact bay 40 by a conductive trace 61 on first face surface 31 of substrate 30 as schematically shown in FIG. 1A or by an internal conductor (not shown) inside substrate 30. Similarly, a contact pad 55 on second face surface 32 shown in FIG. 1B may be electrically connected to a conductive layer 49 of a contact bay 40 by a conductive trace 62 on the second face surface. Substrate 30 may be formed using methods known in the art as a multilayer substrate comprising patterned layers of conducting material sandwiched between layers of insulating material to provide internal conductors (not shown) for connecting a contact pad 51, 53, or 55 to a contact layer 49 of a contact bay 40. A contact pad 51 or 53 may be electrically connected to an internal contact layer by a suitable via (not shown).

A contact pad of a substrate may also be connected to another contact pad of the substrate by a conductive trace, bond wire, or internal conductor to electrically connect different components of a chip or components of two different chips mounted to the substrate. For example, first surface 31 of jigsaw submount 20 comprises two conductive traces 63 each of which connects a circular contact pad 51 to a rectangular contact pad 53. Each trace 63 and the circular and square contact pad 51 and 53 that it connects may be used to connect components in a same chip or different chips by soldering appropriate contact pads of the chip or chips to the contact pads connected by the conductive trace.

As indicated by the variety of shapes of contact bays 40 formed in jigsaw submount 20 shown in FIGS. 1A and 1B, contact bays in accordance with an embodiment of the invention, may be formed having different shapes and/or sizes and contact layers formed from materials having different conductivities and different thicknesses. The various shapes and sizes that a contact bay may assume may be determined responsive to operating conditions that the contact bay is expected to support. For example, large rectangular contact bay 42 in jigsaw submount 20 may be required to provide support for large currents of a relatively large number of field effect transistors (FETs) in a chip or chips mounted to first face surface 31 and/or second face surface 32. Large curved contact bay 43 may be required to provide drain terminals of the FETs with contact to a power source that provides a drain voltage, VDD, and to carry relatively large drain currents. Relatively small contact bays 41 may be required to provide electrical contacts that carry high frequency control signals transmitted by a control circuit to gates of the FETs.

By way of a numerical example, assume that a conductive layer of a contact bay of a jigsaw submount is to be used to provide a voltage, commonly referred to as a voltage $V_{dd}$, equal to about 5 volts to a chip or chips mounted to the jigsaw submount and carry a peak current equal to about 1 A (amperes). Assume further that the contact bay is required to operate in a temperature range from a room temperature equal to about 20° to a maximum operating temperature equal to about 80° C. The contact layer of the bay may be formed from copper having electrical resistance equal to about 19.2 n$\Omega$m (nano-ohm meters) at 25° and temperature coefficient for change of conductivity per degree Kelvin equal to about 0.393% per K/degree. Then the contact bay surface may advantageously have a length equal to about 0.32 mm (millimeters) and a thickness equal to about 35 μm (micrometers).

It is noted that generally it is easier and less expensive to form contact bays having circular bay surfaces. However, for a given length along an edge of a jigsaw submount a contact bay having a polyline bay surface can provide a bay surface having a larger or substantially larger area than a circular bay surface.

Figure 2A:
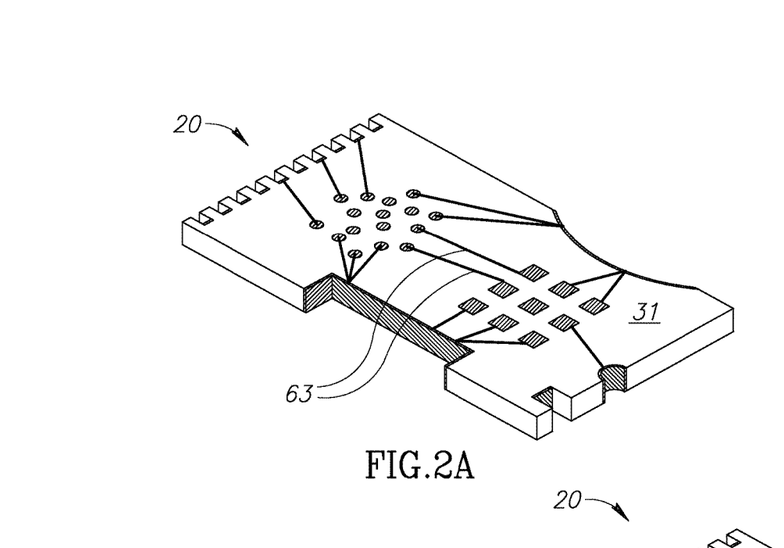
FIGS. 2A-2D schematically illustrate mounting die packages to the first face surface of the jigsaw submount shown in FIGS. 1A and 1B, in accordance with an embodiment of the invention.
Figures 2B, 2C:
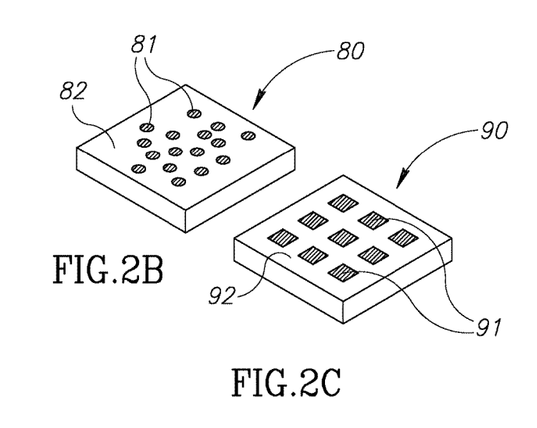
Figure 2D:
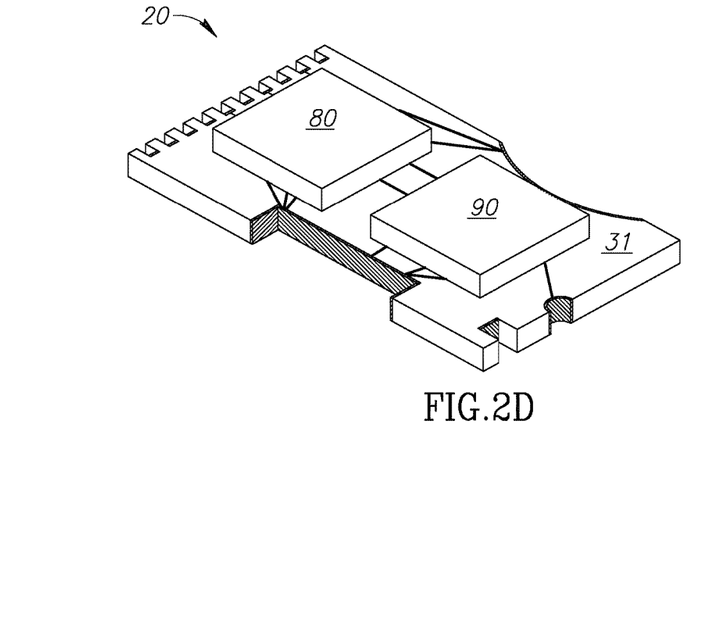

FIGS. 2A-2D schematically illustrate mounting two die packages 80 and 90 to first face surface 31 of jigsaw submount 20 shown in FIGS. 1A and 1B. FIG. 2A shows jigsaw submount in the perspective shown in FIG. 1A. FIGS. 2B and 2C schematically show die packages 80 and 90 respectively. Die package 80 is formed having optionally circular contact pads 81 on a "bottom" surface 82 of the die package that match circular contact pads 51 on first face surface 31 of jigsaw submount 20. Die package 90 is formed having optionally square contact pads 91 on a "bottom" surface 92 of the die package that match square contact pads 53 on first surface 31 of jigsaw submount 20. Die package 80 is placed on jigsaw mount first face surface 31 so that circular contact pads 81 on bottom surface 82 of die package 80 contact homologous square contact pads 53 on first surface 31 of jigsaw submount 20. The homologous contact pads that are in contact, are soldered together using any of various bonding techniques, such as thermal and/or ultrasound bonding, to electrically and mechanically connect the contact pads of packaged chip 80 to homologous contact pads 51 of jigsaw submount 20 and electrically connect die package 80 to desired contact bays 40 of the jigsaw submount. Similarly, square contact pads 91 of die package 90 are placed in contact with, and electrically and mechanically bonded to homologous square contact pads 53 of jigsaw submount 20 to electrically connect die package 90 to desired contact bays 40 of the jigsaw submount. FIG. 2D schematically shows die packages 80 and 90 after mounting to submount 20 in accordance with an embodiment of the invention.

Figure 3A:
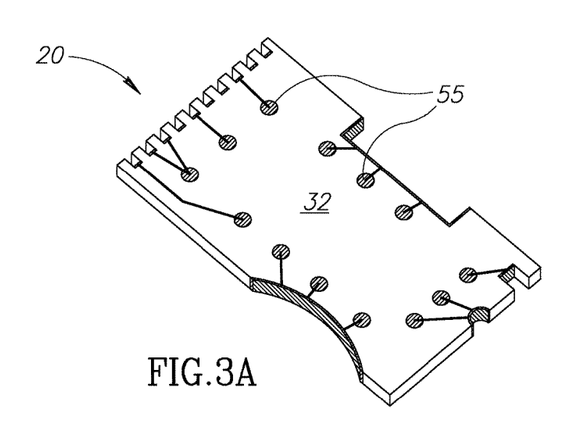
FIGS. 3A-3D schematically show mounting a bare die to the second face surface of the jigsaw submount shown in FIGS. 1A-1B.
Figure 3B:
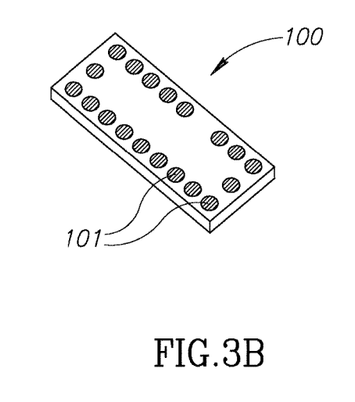
Figure 3C:
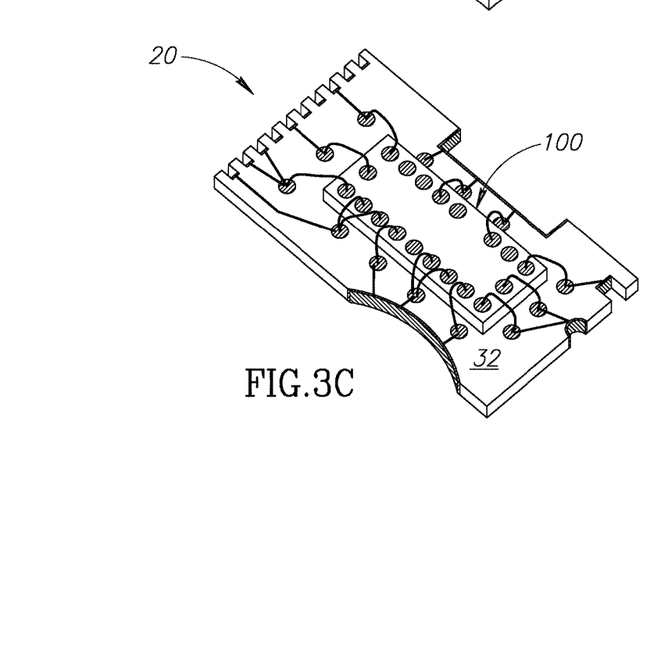
Figure 3D:
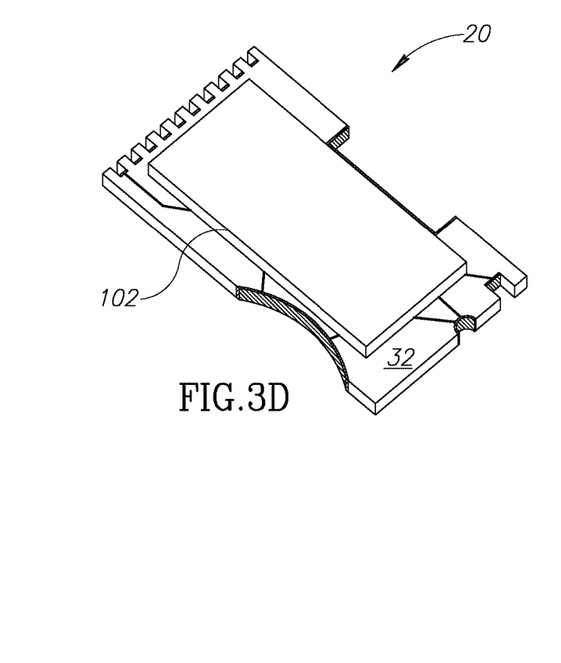

FIGS. 3A-3D schematically illustrate mounting a bare die 100, to second surface 32 of jigsaw submount 20 shown in FIGS. 1A and 1B. FIG. 3A schematically shows jigsaw submount 20 in the perspective shown in FIG. 1B. FIG. 3B schematically shows bare die 100 having contact pads 101. The bare die is positioned on second face surface 32 as schematically shown in FIG. 3C and contact pads 101 on the bare die are wire bonded to contact pads 55 on second face surface 32. Any of various wire bonding techniques known in the art, such as by way of example ball bonding or wedge bonding, may be used to wire bond contact pads 101 on bare die 100 to contact pads 55 on face surface 32. Optionally, as shown in FIG. 3D after wire bonding, bare die 100 is encapsulated in a protective casing 102. Bare die 100 encapsulated in protective casing 102 may be referred to as encapsulated chip 102. A jigsaw submount mounted with plurality of chips such as chips 80, 90 and 102, in accordance with an embodiment of the invention may be referred to as a "jigsaw multichip module" or jigsaw MCM. Jigsaw submount 20 mounted with chips 80, 90 and 102 may be referred to as "jigsaw MCM 20".

Figures 4A, 4B, 4C:
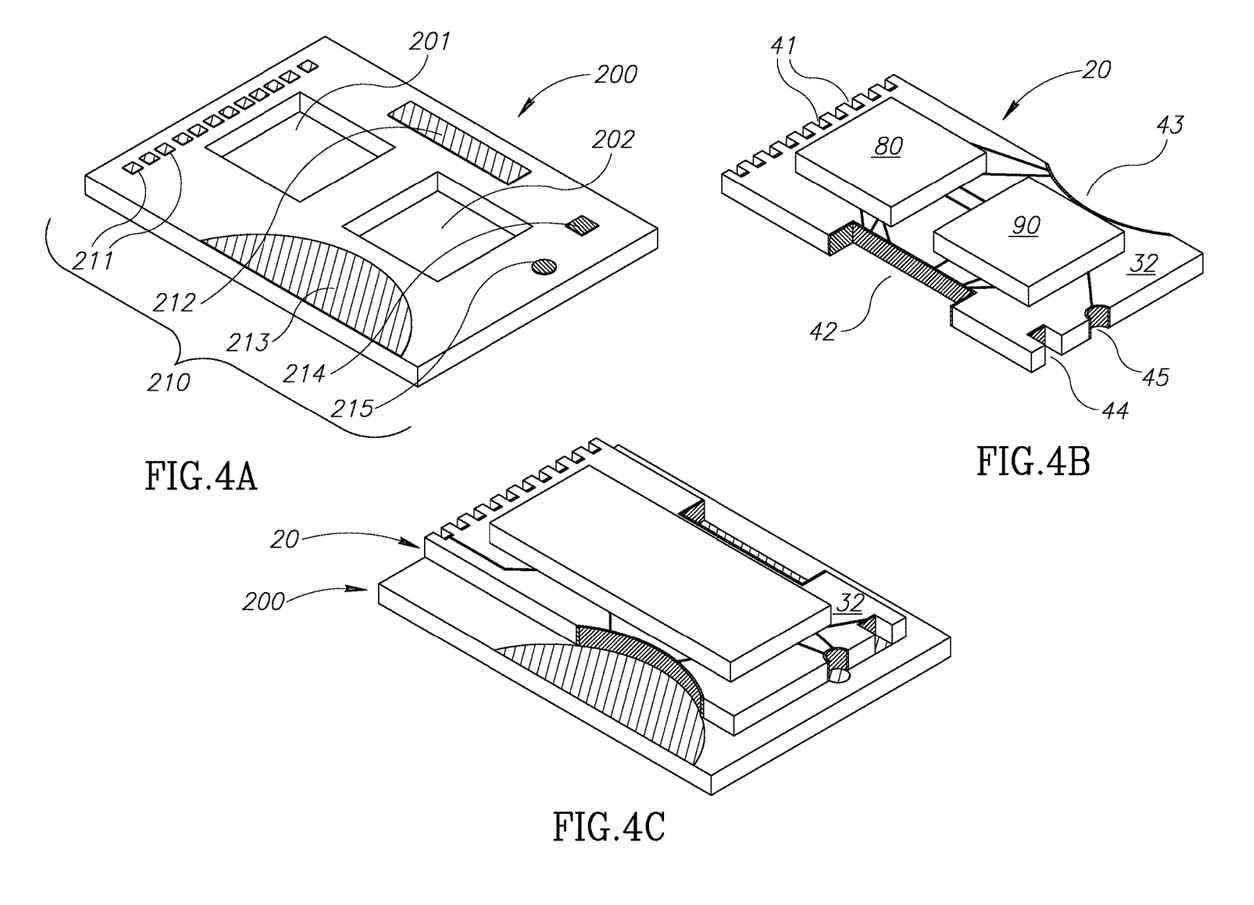
FIGS. 4A-4C schematically show mounting the jigsaw submount having the die packages and bare die mounted to the first and second surfaces of the jigsaw submount, to a jigsaw motherboard in accordance with an embodiment of the invention.

By way of a numerical example, assume that chips 80, 90, and 102 comprised in jigsaw MCM 20 have footprints respectively equal to 8 mm×8 mm, 10 mm×10 mm, and 16 mm×20 mm Assume that a 1 mm wide perimeter around each chip 80, 90, and 102 is required for routing conductive traces that eclectically connect the chip to other chips on the submount and/or contact bays 40 (FIG. 1A). Because chips 80, 90 and 102 are mounted on both face surfaces 30 and 32 (FIGS. 2A, 2C, 3A, 3C, 3D) jigsaw MCM 20 may have a footprint equal to about 18 mm×22 mm FIGS. 4A-4C schematically illustrate mounting jigsaw MCM 20 to a jigsaw motherboard 200 in accordance with an embodiment of the invention. Jigsaw motherboard 200 is optionally formed having two recesses 201 and 202 to receive die packages 80 and 90 mounted to jigsaw submount 20 and conductive lands 210 for making electrical contact between the motherboard and jigsaw submount 20 that match contact bays 40 of jigsaw submount 20. Optionally, recess 201 and/or 202 is a "through recesses" that passes completely through motherboard 200. In an embodiment of the invention, recesses 201 and/or 202 is a "blind recess" that does not pass completely through motherboard 200 and has a bottom surface in the motherboard. Optionally, the bottom of recess 201 and/or 202 is covered with a heat conducting material (not shown) that acts as a heat sink or thermal conductor to dissipate heat generated during operation of die package 80 and/or 90 respectively. The heat sink may be electrically conducting or electrically insulating.

Lands 210 optionally comprise a row of relatively small square lands 211, relatively large rectangular and semicircular lands 212 and 213 respectively, a small square land 214 and a small circle land 215. Lands 211, 212, 213, 214, and 215 are shaped and located to match with, and provide for electrical contact to contact bays 41, 42, 43, 44, and 45 respectively (FIG. 4B). FIG. 4B schematically shows jigsaw submount 20 in the perspective view shown in FIG. 2D. FIG. 4C shows jigsaw MCM 20 mounted to jigsaw motherboard 200.

Whereas jigsaw motherboard 200 is shown receiving a single jigsaw submount, a jigsaw motherboard may be configured to be mounted with, and provide electrical connections to and between a plurality of jigsaw submounts, each comprising a chip or plurality of chips, to provide a desired circuit. Because jigsaw submounts comprise contact bays for providing electrical contact to chips mounted to the submounts, a plurality of submounts that may be required to produce the desired circuit may be positioned on a jigsaw mother board relatively close together so that the desired circuit is characterized by a relatively small footprint.

Figure 5A:
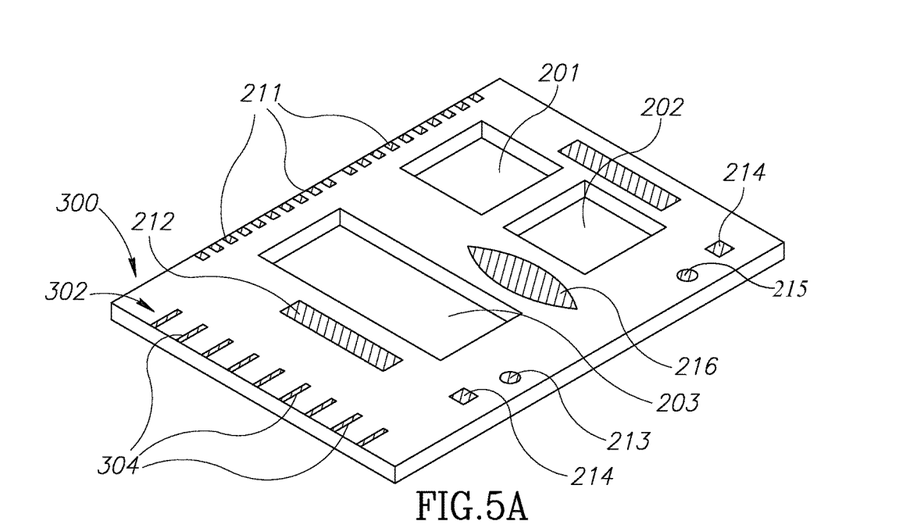
FIG. 5A schematically shows a jigsaw motherboard formed having recesses for receiving chips mounted to a jigsaw submount, in accordance with an embodiment of the invention.
Figures 5B, 5C:
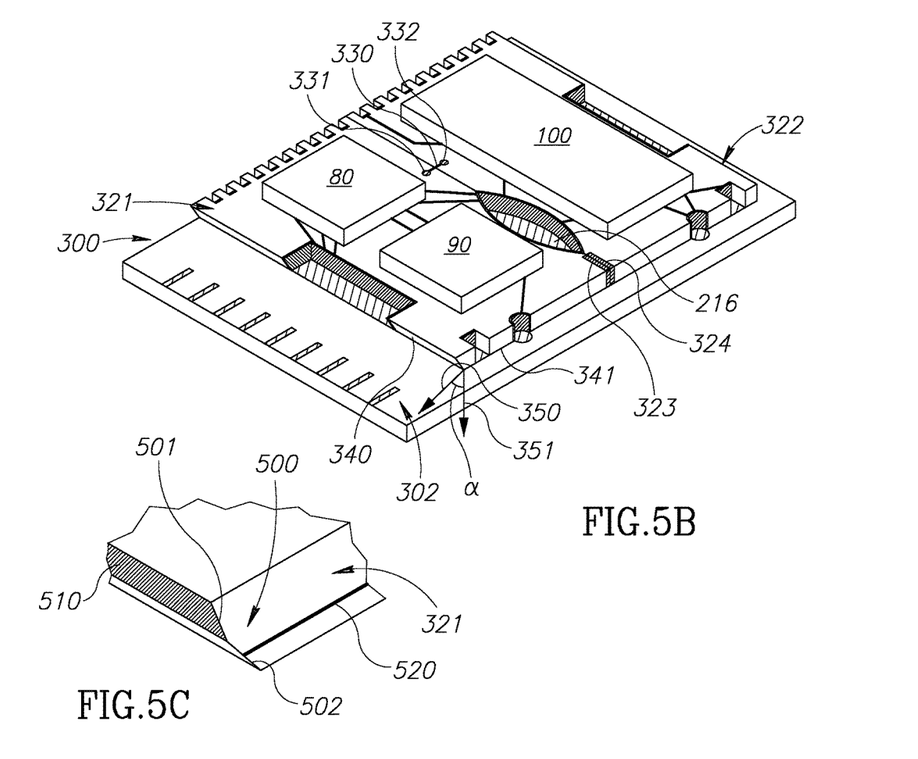
FIG. 5B schematically shows the jigsaw motherboard shown in FIG. 5A mounted with jigsaw MCMs in accordance with an embodiment of the invention.
FIG. 5C schematically shows the jigsaw motherboard shown in FIG. 5A having a faceted edge in accordance with an embodiment of the invention.

By way of example, FIG. 5A shows a jigsaw motherboard 300 configured to receive and provide electrical contact for two jigsaw MCMs 321 and 322 shown mounted to jigsaw motherboard 300 in FIG. 5B. Jigsaw MCMs 321 and 322 are optionally similar to jigsaw MCM 20 having chips 80, 90 and encapsulated chip 102 as shown in FIGS. 4B and 4C. Jigsaw mother board 300 shown in FIG. 5A is formed having recesses 201 and 202 for receiving chips 80 and 90 and a recess 203 for receiving encapsulated chip 102.

Optionally, jigsaw motherboard 300 has an edge connector 302 comprising contact fingers 304 and lands 211, 212, 214, 215, and a land 216 optionally having an area formed by an intersection of two non-concentric circles. Contact fingers 304 may be electrically connected to appropriate lands on the jigsaw motherboard by suitably configured conductive traces (not shown) or internal conductive layers. The lands are configured to provide electrical contact between jigsaw MCMs 321 and 322 and between the jigsaw MCMs and contact fingers 304 of edge connector 302. The jigsaw lands may of course be used to electrically connect components other than MCMs to motherboard 300, to each other, and/or to contact fingers 304.

In an embodiment of the invention, a region of an edge surface of a jigsaw submount that is not a bay surface may be covered with a conducting layer so that when the jigsaw submount is butted up against another jigsaw submount having a matching conductive layer on a region of an edge surface, the two matching conductive layers touch and electrically connect the two jigsaw submounts. A conducting layer on an edge surface of a jigsaw substrate may be referred to as an edge surface conductor. In FIG. 5B jigsaw MCMs 323 and 324 have jigsaw substrates on which chips 80, 90, and 100 are mounted that have edge surface conductors schematically 323 and 324 respectively. In FIG. 5B edge surface conductors 321 and 322 touch and electrically connect jigsaw MCM 321 and jigsaw MCM 322. When butted together, a solder may be flowed between edge surface conductors 323 and 322, or they may be heated so that they fuse to improve their electrical connection. In an embodiment of the invention, two butted together jigsaw MCMs may be directly connected by forming a conducting trace that electrically connects contact pads on respective face surfaces of the jigsaw MCMs. By way of example, In FIG. 5B, a conducting trace 330 connects contact pads 331 and 332 on respective face surfaces of jigsaw MCMs 321 and 322.

Because jigsaw submounts 321 and 322 in accordance with an embodiment of the invention provide electrical contact to chips mounted to the submounts via contact bays, the jigsaw MCMs may be positioned on jigsaw motherboard 300 closely adjacent and substantially "butted" together, as shown in FIG. 5B. As a result, the jigsaw MCMs occupy a relatively small footprint.

It is noted that in jigsaw submounts 20, bay surfaces of bays 40 (FIG. 1A) on which contact layers 49 are located, are shown perpendicular to face surfaces 31 and 32. However, jigsaw submounts in accordance with an embodiment of the invention are not limited to being formed having bays whose bay surfaces are perpendicular to face surfaces of the jigsaw submounts. The bay surface of a contact bay may be angled at an acute angle relative to one of the two face surfaces of its jigsaw substrate. An angle between two surface regions is defined as an angle between their respective normal's to the surfaces, wherein the normal to a surface region is a vector perpendicular to the surface region that points away from the body bounded by the surface region. The face surface relative to which the bay surface is angled at an acute angle is smaller than the other, "larger", face surface of the jigsaw substrate. A jigsaw submount having contact bays oriented at an acute angle relative to a face surface may be mounted with the smaller face surface contacting the jigsaw mother board to reduce an area that the jigsaw submount occupies on the jigsaw motherboard.

By way example, jigsaw MCM 321 has an angled edge surface 340 that makes an acute angle with a bottom face surface 341 of the jigsaw MCM. Edge surface 340 has a normal 350 and face surface 341 has a normal 351. The acute angle between the surfaces is indicated as the angle a between normals 350 and 351. In an embodiment of the invention a is greater than about 60° and less than 90°.

In some embodiments of the invention an edge surface such as an edge surface of jigsaw MSM 321 be faceted and an edge surface conductor be formed to cover one of the facets or a region of one of the facets. By way of example, FIG. 5C schematically shows a cross section of a possible edge surface 500 of jigsaw MSM 321 having optionally two facets 501 and 502. Facet 501 is covered by a conductive layer to form an edge surface conductor 510, which does not cover facet 502. Optionally, were jigsaw MSM 321 to be a multilayer jigsaw MSM having an internal conductive layer 520, faceted edge surface 500 would provide a relatively convenient surface for forming edge surface conductor 500 so that it does not electrically contact layer 520. Edge surface conductor 510 may then be used to provide a conductive "butt" connection to an adjacent jigsaw MSM in accordance with an embodiment of the invention, on a jigsaw motherboard without connecting internal layer 520 to the adjacent jigsaw MSM.

It is noted that wherein in the above description edge surfaces of a jigsaw submount are described and shown having planar, tilted, or faceted surfaces a jigsaw submount in accordance with an embodiment of the invention is not limited to planar surfaces. By way of example, an edge surface of a jigsaw submount in accordance with an embodiment of the invention may comprise a curved or partially curved surface.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

Descriptions of embodiments of the invention in the present application are provided by way of example and are not intended to limit the scope of the invention. The described embodiments comprise different features, not all of which are required in all embodiments of the invention. Some embodiments utilize only some of the features or possible combinations of the features. Variations of embodiments of the invention that are described, and embodiments of the invention comprising different combinations of features noted in the described embodiments, will occur to persons of the art. The scope of the invention is limited only by the claims.

The invention claimed is:

1. An apparatus comprising:
   a submount for connecting a semiconductor or passive device to an external circuit, the submount comprising:
   a planar substrate formed from an insulating material and having relatively narrow edge surfaces and first and second relatively large face surfaces;
   a plurality of recesses formed along an edge surface;
   a layer of a conducting material formed on a surface of each of the at least one recess, wherein at least two recesses of the plurality of recesses differ from each other with respect to one or more of: recess surface shape, recess surface area, and extent of coverage on the surface of the recess by the conducting material layer;
   a first plurality of soldering pads on the first face surface configured to make electrical contact with a semiconductor or passive device;
   a second plurality of soldering pads on the second face surface configured to make electrical contact with a second semiconductor or passive device; and
   electrically conducting connections each of which electrically connects a soldering pad in the first and/or second plurality of soldering pads to the layer of conducting material of a recess of the plurality of recesses; and
   a motherboard for mounting the submount, the motherboard comprising:
   a face surface configured to be apposed to the second face surface of the planar substrate of the submount when the submount is mounted to the motherboard;
   at least one conducting land on the face surface of the motherboard for making electrical contact with the layer of conducting material of a recess of the plurality of recesses formed along the edge surface of the submount when the submount is mounted to the motherboard; and a recess formed on the face surface of the motherboard and dimensioned to receive the second semiconductor or passive device mounted to the second face surface of the submount when the submount is mounted on the motherboard.

2. The apparatus according to claim 1 wherein the electrically conducting connections comprise a conducting trace on the first or second face surface.

3. The apparatus according to claim 1 wherein the electrically conducting connections comprise an internal conductor located inside the planar substrate.

4. The apparatus according to claim 1 wherein a recess of the plurality of recesses formed along the edge surface of the submount has a circular and/or polyline recess surface.

5. The apparatus according to claim 4 wherein, out of the plurality of recesses formed along the edge surface of the submount, at least one recess has a circular recess surface and at least one recess has a polyline recess surface.

6. The apparatus according to claim 1 further comprising a layer of a conducting material formed on at least one portion along the edge surface of the submount.

7. The apparatus according to claim 1 comprising a layer of conductive material formed on at least one portion along the edge surface of the submount between at least two adjacent recesses.

8. The apparatus according to claim 1 wherein the recess in the face surface is a blind recess having a bottom surface in the substrate of the motherboard.

9. The apparatus according to claim 8, wherein the motherboard comprises a layer of material configured to dissipate heat generated by operation of the semiconductor or passive device.

10. The apparatus according to claim 1, wherein the recess in the face surface of the motherboard passes through the motherboard substrate.

11. The apparatus according to claim 1 wherein an angle between at least a portion of the recess surface of the plurality of recesses formed along the edge surface of the submount is angled at an acute angle with respect to a face surface of the first and second face surfaces.

12. The apparatus according to claim 1 wherein a region of an edge surface of the submount is angled at an acute angle with respect to a face surface of the first and second face surfaces.

13. The apparatus according to claim 12 wherein the edge surface of the submount is a faceted surface comprising first and second facets.

14. The apparatus according to claim 13 wherein a region of the second facet is covered with a layer of conducting material.

15. The apparatus according to claim 14 wherein the substrate comprises an internal conductor that makes electrical contact with the layer of conducting material on the second facet.

16. The apparatus according to claim 14 wherein the substrate comprises an internal conductor that does not make electrical contact with the layer of conducting material on the second facet.

17. The apparatus according to claim 1, wherein, when the submount is mounted to the motherboard, there is no air gap between the first face surface of the insulating substrate of the motherboard and the second face surface of the planar substrate of the submount.

18. The apparatus according to claim 1 wherein, out of the plurality of recesses formed along the edge surface of the submount, at least one recess is fully covered with a conductive layer, and at least one recess is partially covered with a conductive layer.

* * * * *